(12) United States Patent
Hashio et al.

(10) Patent No.: US 10,193,127 B2
(45) Date of Patent: Jan. 29, 2019

(54) BATTERY TERMINAL UNIT WITH CURRENT SENSOR

(75) Inventors: Shinichi Hashio, Shimada (JP); Toshirou Mochizuki, Shimada (JP)

(73) Assignee: YAZAKI CORPORATION, Minato-ku, Tokyo (JP)

( * ) Notice: Subject to any disclaimer, the term of this patent is extended or adjusted under 35 U.S.C. 154(b) by 476 days.

(21) Appl. No.: 13/643,394

(22) PCT Filed: Apr. 28, 2011

(86) PCT No.: PCT/JP2011/060807
§ 371 (c)(1),
(2), (4) Date: Oct. 25, 2012

(87) PCT Pub. No.: WO2011/136398
PCT Pub. Date: Nov. 3, 2011

(65) Prior Publication Data
US 2013/0040177 A1    Feb. 14, 2013

(30) Foreign Application Priority Data

Apr. 30, 2010    (JP) .................................. 2010-105309
Nov. 12, 2010    (JP) .................................. 2010-254104

(51) Int. Cl.
*H01M 2/30*    (2006.01)
*G01R 31/36*    (2006.01)
(Continued)

(52) U.S. Cl.
CPC ........ *H01M 2/305* (2013.01); *G01R 31/3696* (2013.01); *H01M 2/30* (2013.01);
(Continued)

(58) Field of Classification Search
None
See application file for complete search history.

(56) References Cited

U.S. PATENT DOCUMENTS 4,009,322 A * 2/1977 Wolf .............................. 429/175
5,552,700 A * 9/1996 Tanabe ............... G01R 19/0092
324/117 H
(Continued)

FOREIGN PATENT DOCUMENTS

CN    101242038 A    8/2008
CN    201951223 U  *  8/2011
(Continued)

OTHER PUBLICATIONS

Ossenberg et al., Translation of DE 10 2004 053650, 5 pages.*
(Continued)

*Primary Examiner* — Ula C Ruddock
*Assistant Examiner* — Anna Korovina
(74) *Attorney, Agent, or Firm* — Sughrue Mion, PLLC

(57) ABSTRACT

A battery terminal unit with a current sensor includes a bus bar for a battery terminal and a receiving portion. The bus bar includes an attachment part attached to a battery post, an extension part extended from the attachment part, and a connection part which continues to the extension part and is configured to connect a wire harness. The receiving portion receives a board on which a magnetic detection element is mounted so that the board is opposed to a surface of the extension part. The attachment part, the extension part and the connection part are integrally formed. The connection part continues to the extension part through an extending portion bent from the extension part so as to be positioned laterally to the extension part.

10 Claims, 14 Drawing Sheets

(51) Int. Cl.
*H01R 11/28* (2006.01)
*H01R 13/66* (2006.01)
*H01M 10/48* (2006.01)

(52) U.S. Cl.
CPC .......... *H01M 10/48* (2013.01); *H01R 11/287* (2013.01); *H01R 13/6683* (2013.01)

(56) References Cited

U.S. PATENT DOCUMENTS

| | | | |
|---|---|---|---|
| 6,383,037 B2* | 5/2002 | Krause | H01R 13/7137 200/400 |
| 6,512,443 B1* | 1/2003 | Matsumura et al. | 337/189 |
| 2002/0051906 A1* | 5/2002 | Wakata et al. | 429/178 |
| 2003/0057770 A1 | 3/2003 | Heim | |
| 2007/0194747 A1* | 8/2007 | Alvarez-Troncoso | B60R 16/03 320/104 |
| 2008/0050985 A1 | 2/2008 | Roset et al. | |
| 2008/0194152 A1 | 8/2008 | Roset et al. | |
| 2009/0184683 A1 | 7/2009 | Abe | |
| 2009/0229654 A1* | 9/2009 | Morita et al. | 136/251 |
| 2010/0019733 A1* | 1/2010 | Rubio | 320/136 |
| 2010/0066350 A1* | 3/2010 | Matsumura et al. | 324/120 |
| 2010/0066351 A1 | 3/2010 | Condamin et al. | |
| 2010/0316901 A1* | 12/2010 | Matsushima et al. | 429/121 |
| 2011/0062945 A1 | 3/2011 | Condamin et al. | |
| 2011/0306243 A1* | 12/2011 | Shiraki | 439/620.29 |
| 2012/0233840 A1* | 9/2012 | Motoyama | 29/428 |
| 2013/0154617 A1 | 6/2013 | Kawaguchi et al. | |
| 2013/0252050 A1* | 9/2013 | Uematsu | H01R 11/287 429/91 |

FOREIGN PATENT DOCUMENTS

| | | | |
|---|---|---|---|
| DE | 10 2004 053 650 A1 | 5/2006 | |
| DE | 10 2004 055 848 A1 | 5/2006 | |
| JP | 2002-141054 A | 5/2002 | |
| JP | 2003-517613 A | 5/2003 | |
| JP | 2008-524568 A | 7/2006 | |
| JP | 2009-150653 A | 7/2009 | |
| JP | 2009-177903 A | 8/2009 | |
| JP | 2009-193708 A | 8/2009 | |
| JP | 2011228186 A * | 11/2011 | |
| WO | 2006/048231 A1 | 5/2006 | |
| WO | 2012/039514 A1 | 3/2012 | |
| WO | WO-2012067251 A1 * | 5/2012 | H01R 11/287 |

OTHER PUBLICATIONS

Kageyama JP 2009-150653 Translation; 23 pages total.*
Office Action, dated Jan. 15, 2014, issued by the European Patent Office in counterpart European Patent Application No. 11722186.1.
International Search Report (PCT/ISA/210) dated Oct. 8, 2011, issued by the International Searching Authority in International Application No. PCT/JP2011/060807.
Written Opinion (PCT/ISA/237) dated Oct. 8, 2011, issued by the International Searching Authority, in International Application No. PCT/JP2011/060807.
Communication dated Sep. 9, 2014 issued by the Japanese Patent Office in counterpart Japanese Patent Application No. 2010-254104.
Office Action dated Apr. 3, 2014 issued by the State Intellectual Property Office of the People's Republic of China in counterpart Chinese Patent Application No. 201180009675.7.
Office Action dated Dec. 10, 2014 issued by the State Intellectual Property Office of the People's Republic of China in counterpart Chinese Patent Application No. 201180009675.7.

* cited by examiner

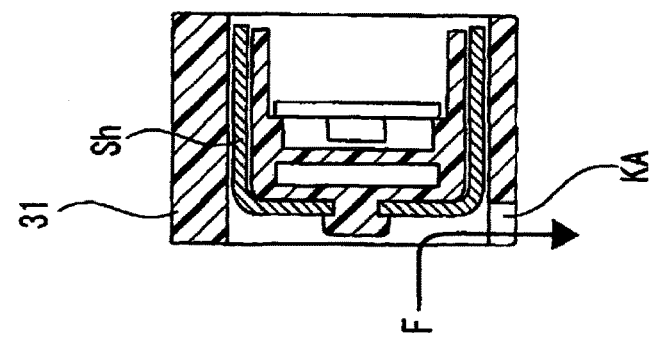
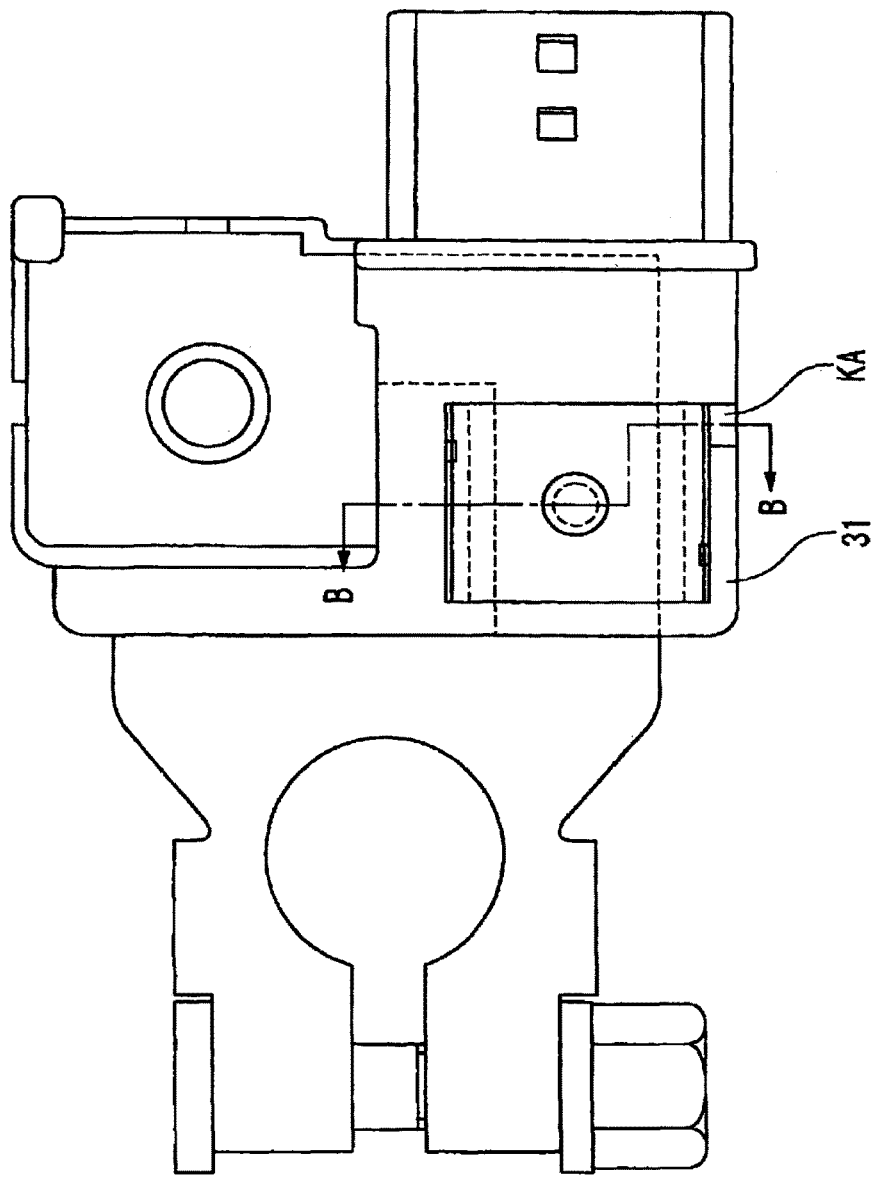
FIG.11A
FIG.11B

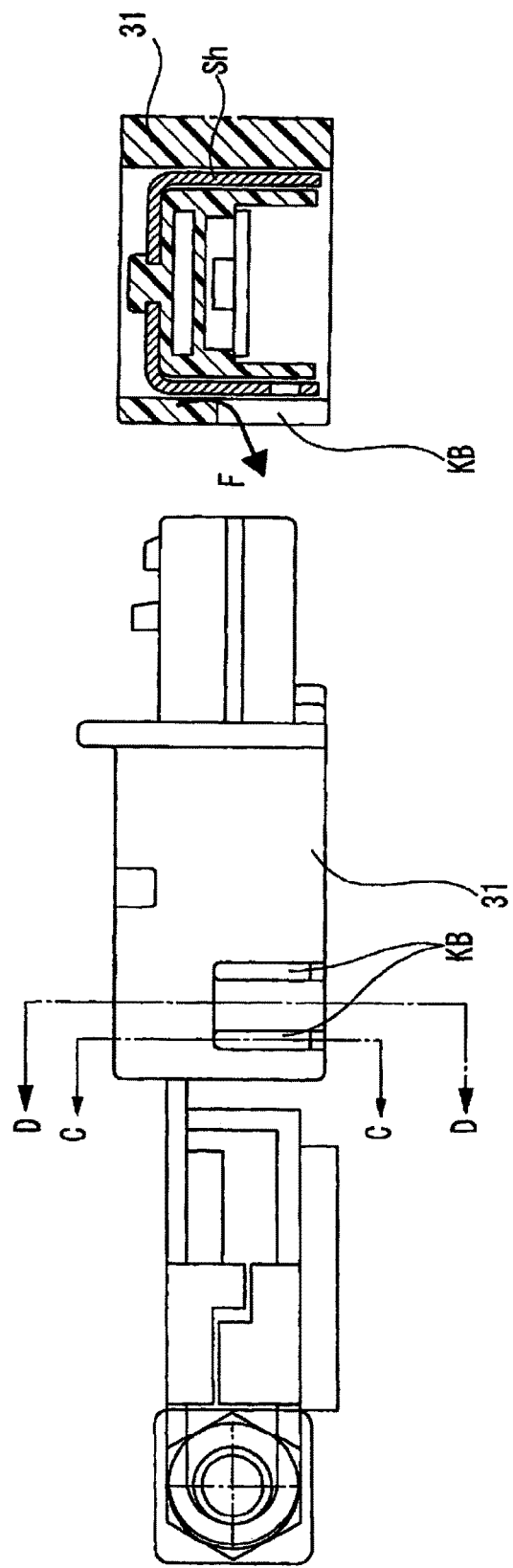
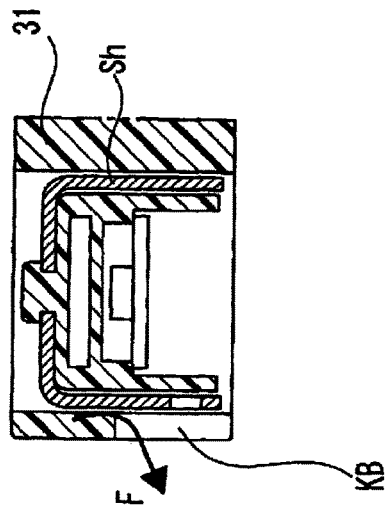
FIG. 12A
FIG. 12B

BATTERY TERMINAL UNIT WITH CURRENT SENSOR

TECHNICAL FIELD

This invention relates to a battery terminal unit with a current sensor.

BACKGROUND ART

Recently, kinds and the number of electric components of a vehicle have increased rapidly and exhaustion of a vehicle-mounted battery has become more intense. As a result, there is a desire to monitor the remaining capacity of the battery. In such a case, a method for attaching a current sensor to a battery post and detecting a degree of exhaustion of the battery by magnitude of this current is proposed. In that case, the periphery of the battery post has no space sufficient to attach the current sensor and also, a touch in the case of attaching the current sensor to the side of a harness connected to the battery post may damage the sensor in consideration of attachment of the harness itself, and measures taken against this include a method for mounting a current sensor on a relay member coupled through fastening means capable of connecting and disconnecting both of a battery terminal and a harness side terminal (for example, see PTL 1).

CITATION LIST

Patent Literature

[PTL 1] JP-A-2002-141054

FIG. 7 is a perspective view showing a conventional battery terminal unit with a current sensor against the invention, and FIG. 8 is a perspective view showing a state of mounting the battery terminal unit with the current sensor of FIG. 7 on a battery post. In FIG. 7, the battery terminal unit 70 with the current sensor is constructed by a battery mounting terminal 80 and the current sensor 90 attached to this battery mounting terminal 80.

<Battery Mounting Terminal 80>

The battery mounting terminal 80 is formed by bending a bus bar, and includes an attachment part 81 attached to a battery post BP, an extension part 82 extended from the attachment part 81 and a connection part 83 for making connection to a wire harness W (FIG. 8).

<<Attachment Part 81>>

The attachment part 81 has a tightening ring 81R capable of being fitted into the battery post BP (FIG. 8) from the upper portion. This tightening ring 81R is roundly bent so as to form a tube shape being opened vertically, and both ends roundly bent extend laterally oppositely and form opposed walls 81W, 81W and face each other. A bolt 81B for fastening for narrowing the tightening ring 81R transversely extends through both the opposed walls 81W, and a distance between the opposed walls 81W becomes short according to tightening between the bolt 81B and a nut 81N and thus, the tightening ring 81R is narrowed and is bitten into the battery post BP.

<<Extension Part 82>>

The extension part 82 is an intermediate portion in which one of both the opposed walls 81W, 81W in the tightening ring 81R extends and reaches the connection part 83. The current sensor 90 is arranged in proximity to the extension part 82 and a current flowing through this extension part 82 is detected by the current sensor 90.

<<Connection Part 83>>

An attachment part 83T is formed in the top of the connection part 83, and an insertion hole 83H of a bolt 83B (FIG. 8) constructing fastening means together with a nut 83N (FIG. 8) is opened in this attachment part 83T.

<Wire Harness Terminal WT>

A wire harness terminal WT (FIG. 8) is connected to the end of the wire harness W connected to a load and also includes a coupling plate WR with substantially the same width as that of the connection part 83 in the front. Also, an insertion hole WH aligned with the insertion hole 83H of the connection part 83 in the case of being aligned and stacked on the connection part 83 extends through this coupling plate WR.

<Current Sensor 90>

The current sensor 90 includes a sensor body 91 with a built-in detector for detecting a current supplied from a battery B to the load connected to the wire harness W (FIG. 8), and a connector 92 projected integrally to a lateral part of the sensor body 91.

<<Sensor Body 91>>

Inside the sensor body 91, the current detector is arranged in proximity to the extension part 82 and a current flowing through this extension part 82 is detected by the current sensor 90.

<<Connector 92>>

The connector 92 is molded integrally to the sensor body 91 so as to continue to the lateral part of the sensor body 91. The connector 92 is formed in a tube shape opened to one side and terminal fittings are incorporated into the inside of the connector 92. The connector 92 is fitted into the other connector connected to a current detection circuit, and electrical continuity between the terminal fittings of the inside is enabled.

<Integration Between Battery Mounting Terminal 80 and Current Sensor 90>

The current sensor 90 constructed as described above is fixed to the extension part 82 by inserting the extension part 82 into a slit 91S formed in a cabinet to which the current sensor 90 is attached. Consequently, the cabinet of the current sensor 90 is integrated with the battery mounting terminal 80 and in that state, the integrated member is carried in a field site of connection to the battery post BP.

<Mounting of Battery Mounting Terminal 80 on Battery Post BP>

Next, such a battery mounting terminal 80 is mounted on the battery post BP. In FIG. 8, B is a battery mounted in a vehicle, and the battery post BP (see FIG. 4 and only one side is shown in FIG. 8) made of a pair of lead electrodes is erected on an upper surface of the battery. This battery post BP is formed in a circular truncated cone shape with a taper slightly toward the top and when the battery post BP is inserted into the tightening ring 81R of the battery mounting terminal 80 (FIG. 7) and the bolt 81B for fastening is fastened, the tightening ring 81R narrows and an inner peripheral surface of the tightening ring 81R bites into the battery post BR Consequently, the battery mounting terminal 80 is mounted on the battery post BP and electrical connection is made.

<Connection of Wire Harness W to Battery Mounting Terminal 80>

On the other hand, in the wire harness terminal WT made by crimping the wire harness W in one end, the coupling plate WR is stacked on the attachment part 83T of the connection part 83 (FIG. 7) and the insertion hole 83H is aligned with the insertion hole WH and the bolt 83B is inserted into both the holes and is screwed into the nut 83N and thereby, a state of connection between the battery mounting terminal 80 (FIG. 7) and the wire harness W is obtained.

Finally, connection work is completed by fitting the other connector into the connector 92 molded integrally to the sensor body 91 in a lateral part of the current sensor body 91.

In the battery terminal unit 70 (FIG. 7) with the current sensor assembled thus, a current flowing between the battery B and the load is detected by the current sensor 90 which is an annular current detector and the extent of exhaustion of the battery can be decided according to its detected value.

The above is the conventional battery terminal unit 70 with the current sensor.

<Advantage of Conventional Battery Terminal Unit 70 with Current Sensor>

According to the conventional battery terminal unit 70 as described above, work of tightening of the bolt and the nut for connection between the connection part 83 and the wire harness terminal WT is performed in a position distant from the battery post BP, that is, in a place in which empty space is ensured relatively in the periphery of the battery, so that there is an advantage that even when work using a tool is done, the work is not particularly blocked and can be done smoothly.

<Problem of Conventional Battery Terminal Unit 70>

However, in the conventional battery terminal unit 70, a place from the battery post BP (FIG. 8) to the wire harness terminal WT through the current sensor body 91 is arranged in one straight line and also the bolt 81B for fastening to the battery post BP is disposed between the battery post BP and the current sensor body 91, so that there is a problem that an overhang dimension of this direction increases and large attachment space must be required inside a vehicle engine room.

SUMMARY OF INVENTION

Technical Problem

The invention has been implemented to solve the problem described above, and an object of the invention is to provide a battery terminal unit with a current sensor unnecessary to ensure large attachment space inside a vehicle engine room.

Solution to Problem

In order to achieve the above object, according to the present invention, there is provided a battery terminal unit with a current sensor, comprising:
a bus bar for a battery terminal, the bus bar including:
an attachment part attached to a battery post;
an extension part extended from the attachment part; and
a connection part which continues to the extension part and is configured to connect a wire harness; and
a receiving portion that receives a board on which a magnetic detection element is mounted so that the board is opposed to a surface of the extension part,
wherein the attachment part, the extension part and the connection part are integrally formed; and
wherein the connection part continues to the extension part through an extending portion bent from the extension part so as to be positioned laterally to the extension part.

Preferably, the attachment part includes a cylindrical part having a slit, and opposed walls extended from both ends of the cylindrical part so as to be opposed to each other, the both ends being adjacent to the slit, the opposed walls having through holes respectively, wherein the opposed walls, the cylindrical part and the extension part are arranged in this order, and wherein the attachment part pinches the cylindrical part to a battery post by fastening a fastening member inserted into the through holes of the opposed walls with respect to the opposed walls.

Preferably, the battery terminal unit, further includes a shield plate having a U shape, wherein the extension part has a first face and a second face which is opposite to the first face, wherein the board is attached to the second face, wherein the shield plate is attached to the first face of the extension part so that both end portions of the shield plate is inserted into the extension part, wherein the magnetic detection element and the extension part are covered with the shield plate, and wherein the shield plate is arranged so as to be directed to a battery.

Preferably, a drainage path for draining water drops falling on the shield plate to the outside of the receiving portion is formed in a peripheral wall constructing the receiving portion.

Preferably, the drainage path has at least one of a notch in which a part of an upper portion of the peripheral wall is notched, an elongated slit extending through at a lower portion of the peripheral wall, and a through hole vertically extending and formed on the peripheral wall.

Advantageous Effects of Invention

According to the above configuration, the connection part is offset with respect to an extension direction of the extension part (measured part), so that an overhang from the battery edge can be decreased. That is, while the overhang reaches "a bolt for fastening plus a current sensor body plus the connection part" as can be seen from FIG. 8 in a conventional unit, the overhang reaches only the longer dimension of "the current sensor body" or "the connection part" in the first invention.

Further, the magnetic detection element as the current sensor can be received and arranged in the inside, so that positioning to the extension part (measured part) can be performed by a simple structure and it is unnecessary to position and fix the current sensor (unit) to the bus bar.

According to the above configuration, the opposed walls are provided in the side opposite to the extension part in the attachment part, so that a length to the extension part can be shortened and the overhang can be decreased further.

According to the above configuration, shield means can be attached easily.

According to the above configuration, water drops failing from an upper portion of the sensor body flow out to the outside of the sensor body speedily, so that the shield plate does not corrode and therefore, the fear of causing an error in an output of the magnetic detection element is eliminated.

BRIEF DESCRIPTION OF DRAWINGS

FIG. 5A is the view seen from the upper portion, and FIG. 5B is the view seen with the lower portion turned up.

FIG. 11A is a plan view of the battery terminal unit with the current sensor, and FIG. 11B is a sectional view taken on line B-B of FIG. 11A.

FIG. 12A is a front view of the battery terminal unit with the current sensor, and FIG. 12B is a sectional view taken on line C-C of FIG. 12A.

DESCRIPTION OF EMBODIMENTS

A battery terminal unit with a current sensor according to an embodiment, unnecessary to ensure large attachment space inside a vehicle engine room, will hereinafter be described based on the drawings.

<Outline of Battery Terminal Unit with Current Sensor According to the Embodiment>

Figure 1:
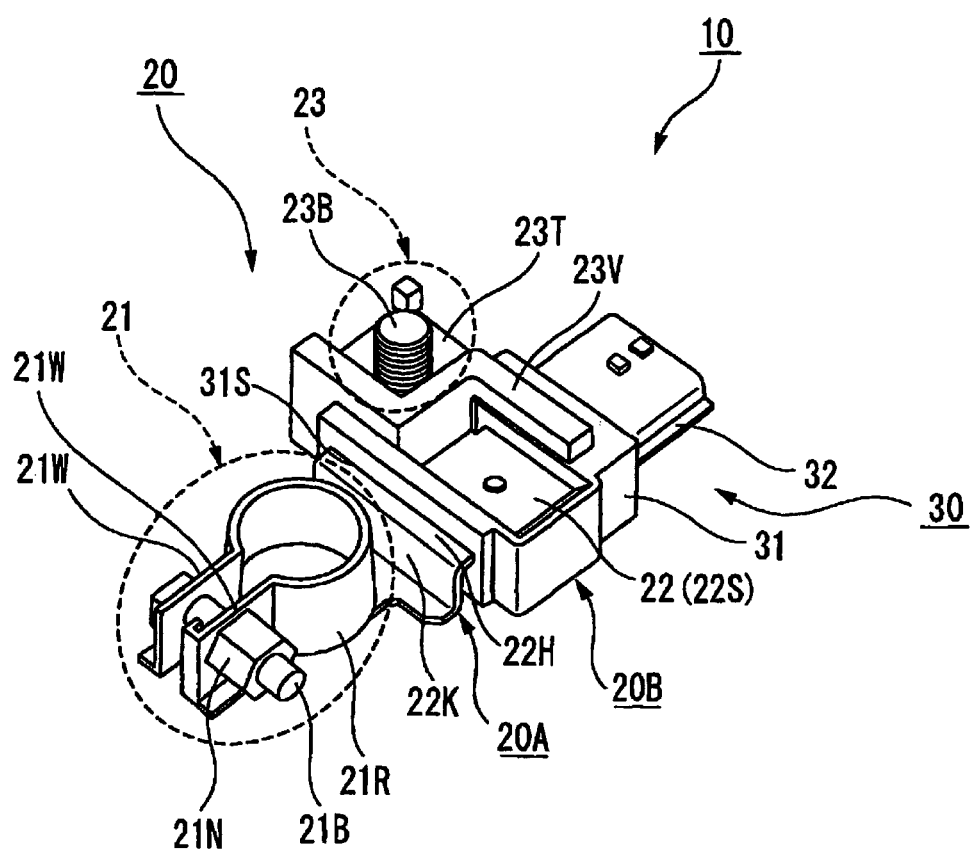
FIG. 1 is a perspective view showing a battery terminal unit with a current sensor according to an embodiment.
Figure 2:
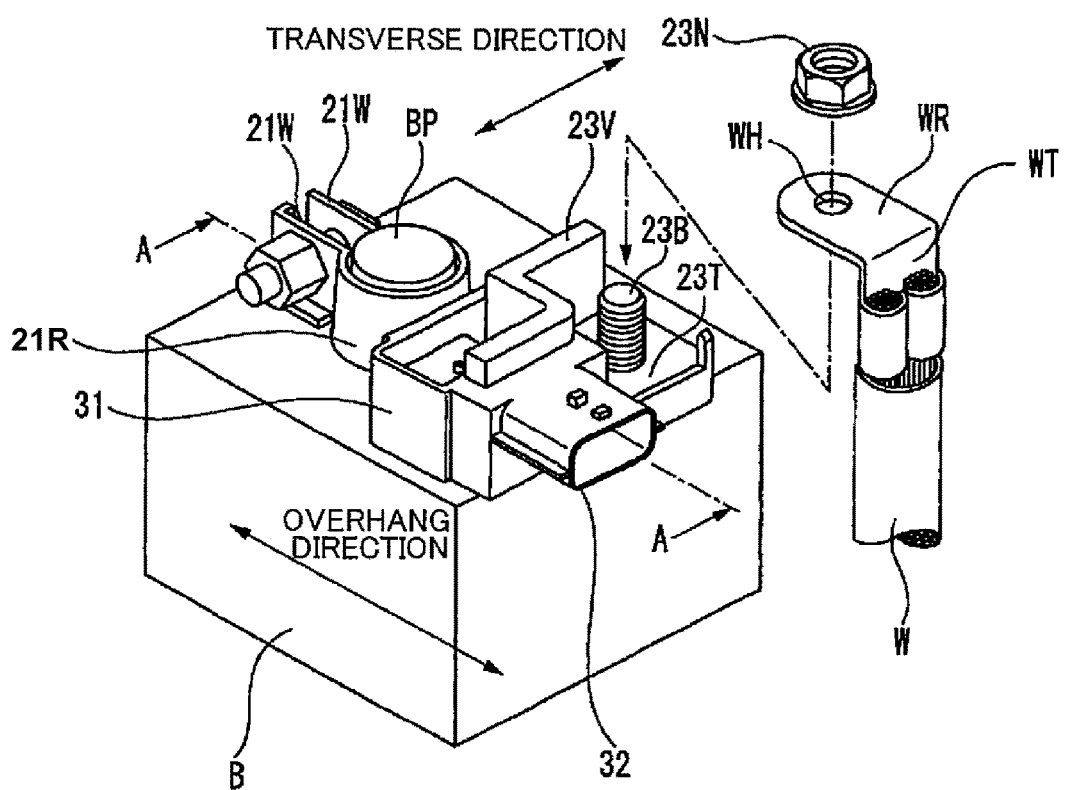
FIG. 2 is a perspective view showing a state of mounting the battery terminal unit with the current sensor of FIG. 1 on a battery post.

FIG. 1 is a perspective view showing a battery terminal unit with a current sensor according to the embodiment, and FIG. 2 is a perspective view showing a state of mounting the battery terminal unit with the current sensor of FIG. 1 on a battery post.

In FIG. 1, the battery terminal unit 10 with the current sensor has a battery mounting terminal 20 and the current sensor 30 attached to this battery mounting terminal 20.

This battery mounting terminal 20 and the current sensor 30 will hereinafter be described based on FIGS. 1 and 2.

<Battery Mounting Terminal 20 According to the Embodiment>

Figure 5A:
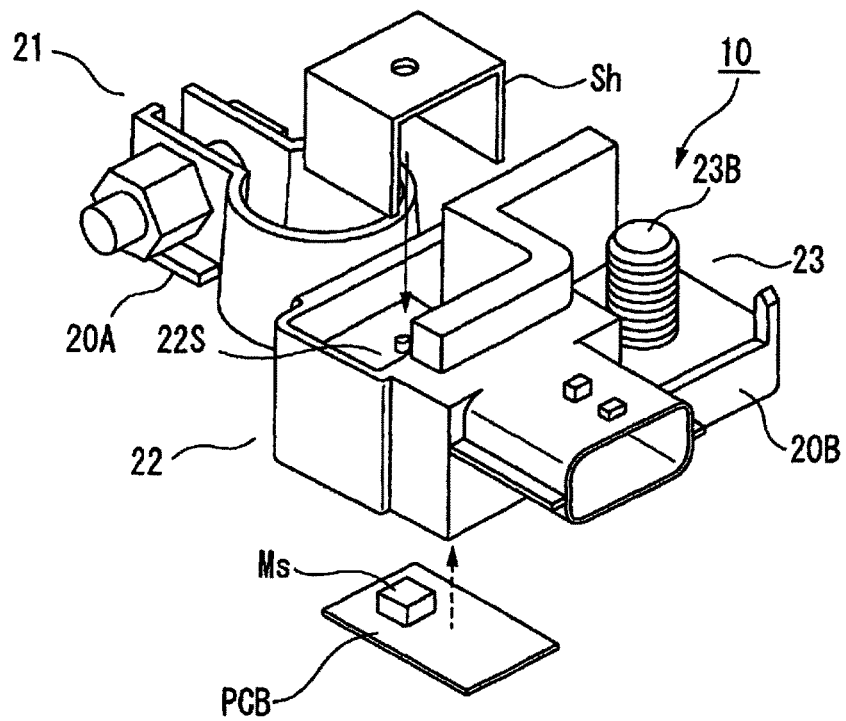
FIGS. 5A and 5B are component development views of the battery terminal unit with the current sensor according to the embodiment.
Figure 5B:
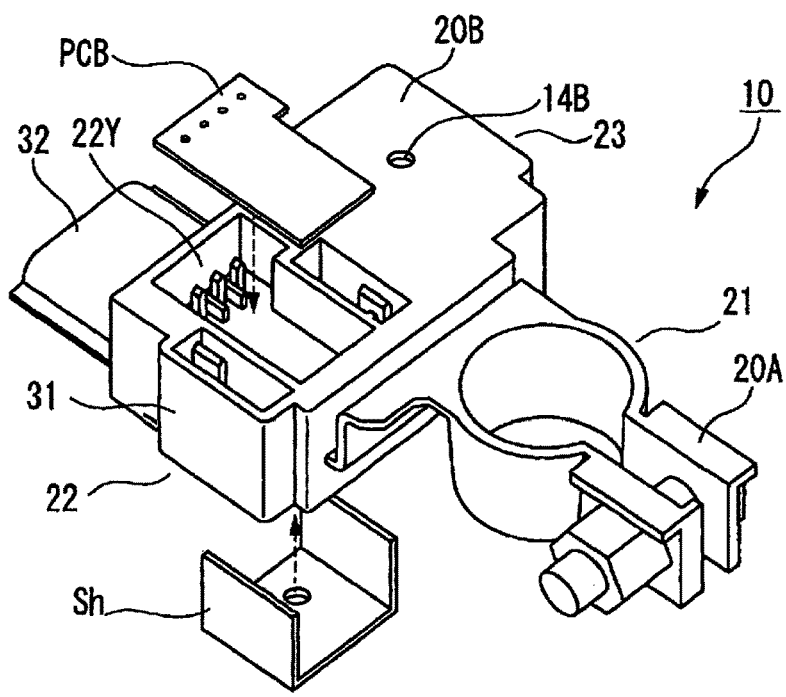
Figure 6:
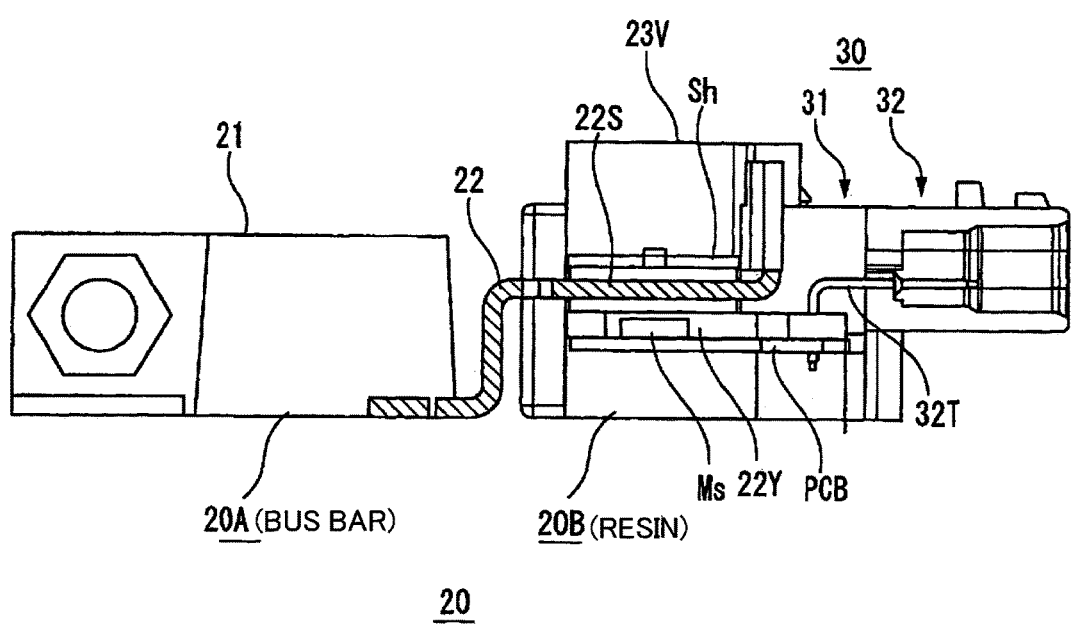
FIG. 6 is a sectional view taken on line A-A of FIG. 2.

In the battery mounting terminal 20 according to the embodiment, both of a bolt 23B for fixing a wire harness and a bus bar 20A (FIGS. 3 and 6) formed by bending are integrally formed by insert molding with a resin 20B (FIG. 6). The battery mounting terminal 20 functionally includes an attachment part 21 attached to a battery post BP (FIG. 2), an extension part 22 to which the current sensor 30 is arranged in proximity, and a connection part 23 for making connection to a wire harness W. In a narrow part 22S (FIGS. 3 and 6), openings are formed in the upward and downward directions and the periphery is molded with resin, and a U-shaped shield plate Sh (described below in FIG. 5) is inserted from the upward opening, and the downward opening forms a receiving portion 22Y (FIGS. 5 and 6) in which a PCB (Printed Circuit Board described below) is received and arranged.

<<First Feature of the Embodiment>>

In the conventional battery terminal unit, the attachment part 81, the extension part 82 and the connection part 83 are arranged in one straight line, but the embodiment is characterized in that the attachment part 21, the extension part 22 and the connection part 23 are not arranged in one straight line and the connection part 23 is arranged so as to transversely offset (FIG. 2) from a straight line connecting the attachment part 21 and the extension part 22 as can be seen from FIGS. 1 and 2. Therefore, the battery terminal unit with the current sensor unnecessary to ensure the large attachment space inside the vehicle engine room can be ensured.

<Three-Dimensional Shape of Bus Bar According to the Embodiment Capable of Offset Arrangement>

Figure 3A:
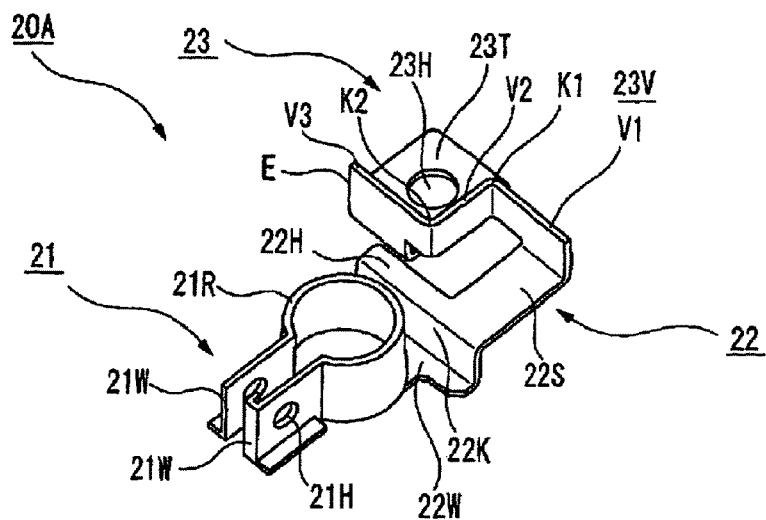
FIGS. 3A to 3C are perspective views describing a shape of a bus bar constructing the battery terminal unit with the current sensor according to the embodiment and seen from three directions.
Figure 3B:
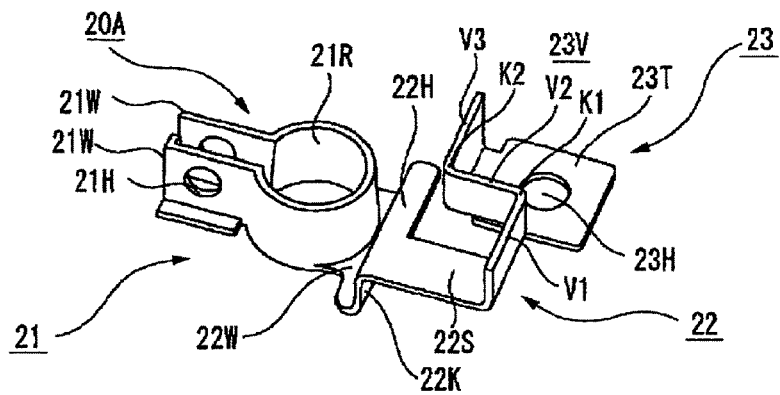
Figure 3C:
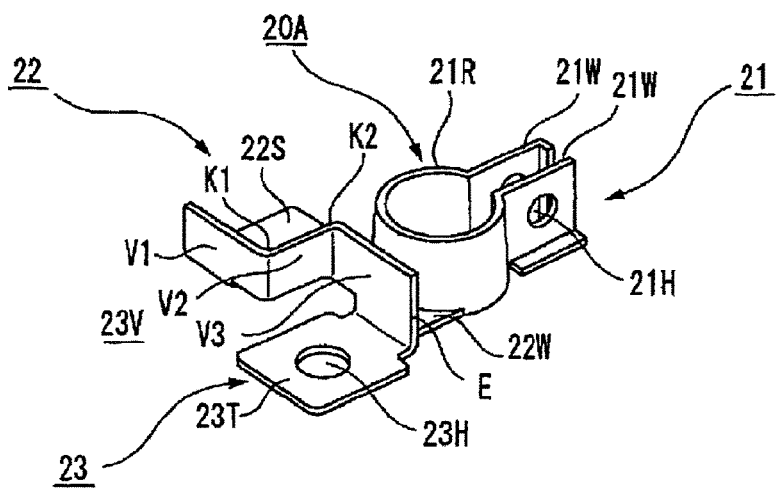

FIG. 3 is a perspective view depicting a three-dimensional shape of the bus bar capable of this offset arrangement from three directions, and FIG. 3A is the view seen from the side of the attachment part 21 (FIG. 1) and FIG. 3B is the view seen from the side of the extension part 22 (FIG. 1) and FIG. 3C is the view seen from the side of the connection part 23 (FIG. 1).

It is apparent from FIGS. 3A to 3C that the connection part 23, the extension part 22 and the attachment part 21 constructing the bus bar 20A respectively have the following three-dimensional shape and thereby the connection part 23 is arranged so as to transversely offset from the straight line connecting the attachment part 21 and the extension part 22.

The three-dimensional shape of the attachment part 21, the extension part 22 and the connection part 23 will hereinafter be described based on FIG. 3.

<<Attachment Part 21>>

The attachment part 21 has a tightening ring 21R capable of being fitted into the battery post BP (FIG. 2) from the upper portion. This tightening ring 21R is roundly bent so as to form a tube shape opened vertically, and both ends roundly bent extend laterally oppositely and form opposed walls 21W, 21W and face each other. Each of both the opposed walls 21W, 21W is provided with a through hole 21H for inserting a bolt 21B (FIG. 1) for fastening in common and therefore, the bolt 21B for fastening for narrowing the tightening ring 21R transversely extends through both the opposed walls 21W, 21W and a distance between the opposed walls 21W becomes short according to tightening between the bolt 21B and a nut 21N (FIG. 1) and thus, the tightening ring 21R is narrowed and is bitten into the battery post BP. The extension part 22 extends substantially horizontally from the lower edge opposite to both the opposed walls 21W, 21W in the tightening ring 21R, and the top of the extension part 22 is upward bent to form a step and the extension part 22 is formed by further extending horizontally via the step.

<<Extension Part 22>>

The extension part 22 is a portion of the bus bar 20A and is an intermediate portion extending from the lower edge opposite to both the opposed walls 21W, 21W in the tightening ring 21R to the connection part 23. The extension part 22 is formed of a wide part 22W horizontally extending with a width of a diameter of the tightening ring 21R from the lower edge opposite to both the opposed walls 21W, 21W in the tightening ring 21R, a bent part 22K upward bent from the wide part 22W, a horizontal part 22H horizontally extending via the step formed in the bent part 22K, and the narrow part 22S which becomes narrow to one-half or less of the width of the diameter of the tightening ring 21R from the horizontal part 22H and horizontally extends in a state of being offset from a center line of the tightening ring 21R to one side. A magnetic detection element Ms (described below in FIGS. 5 and 6) of the current sensor 30 is arranged in proximity to the narrow part 22S of this extension part 22. Then, the connection part 23 (described below) is formed in a state of being offset from a length direction of the connection part 23.

<<Second Feature of the Embodiment>>

The embodiment is characterized in that the bolt 21B for fastening to the battery post BP is arranged in the side opposite to the extension part 22 (that is, a current sensor body 31 (FIG. 1)) with respect to the battery post BP. Consequently, only the longer one of "the current sensor body" or "the connection part" has an overhang dimension (FIG. 2) in an overhand direction from the battery post BP, and the overhang dimension can be decreased. Therefore, a conventional problem that the large attachment space must be ensured inside the vehicle engine room is solved.

Figure 7:
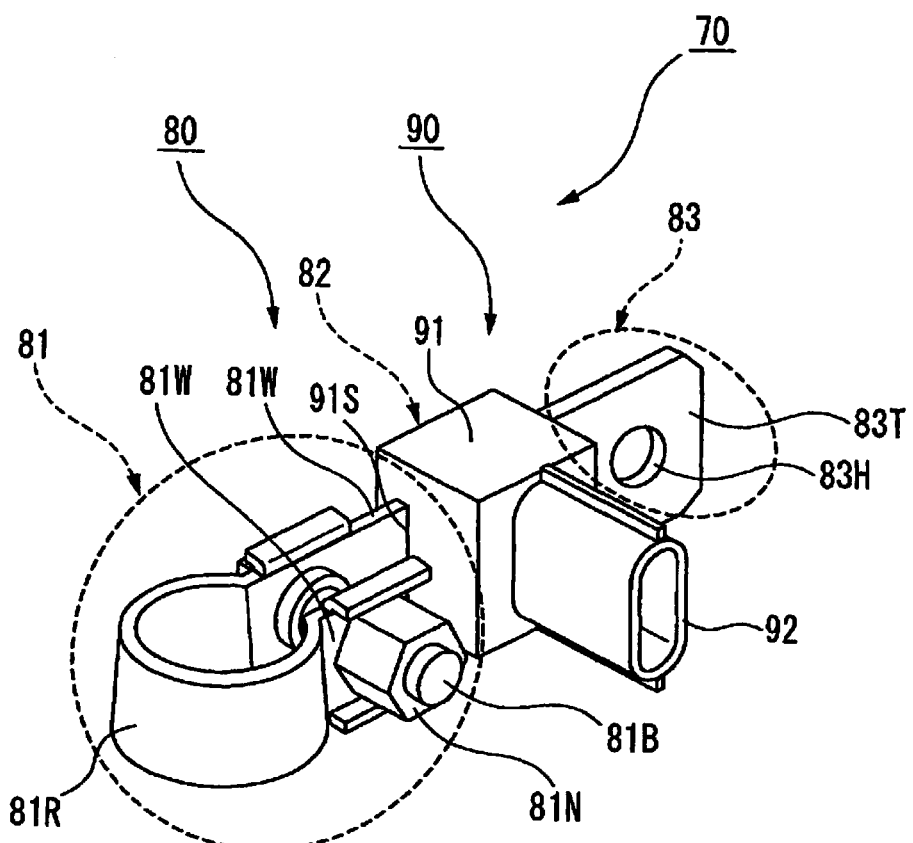
FIG. 7 is a perspective view showing a conventional battery terminal unit.
Figure 8:
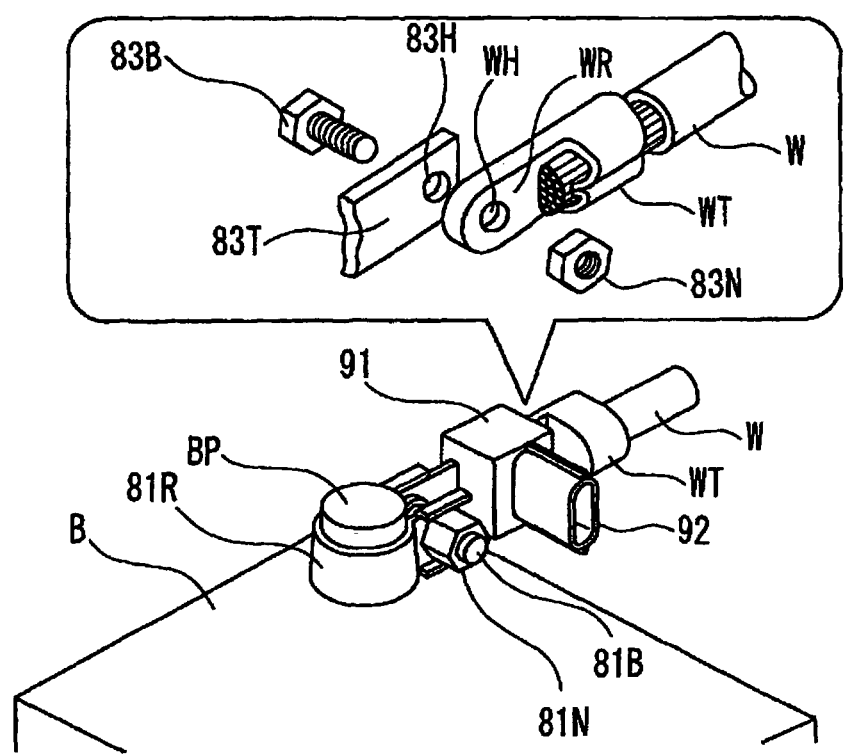
FIG. 8 is a perspective view showing a state of mounting the battery terminal unit with a current sensor of FIG. 7 on a battery post.

On the other hand, in the conventional battery terminal unit (FIG. 7), the bolt 81B for fastening to the battery post BP is arranged in the same side as the current sensor body 91 with respect to the battery post BP, so that the overhang dimension increases and reaches "the bolt for fastening plus the current sensor body plus the connection part" and it becomes necessary to ensure the large attachment space inside the vehicle engine room.

<<Connection Part 23>>

Returning to FIG. 3, the connection part 23 continues from the end of the narrow part 22S of the extension part 22 through an extending portion 23V perpendicularly upward bent. This extending portion 23V has first to third extension walls bent as described below.

<<First Extension Wall V1>>

The first extension wall V1 extends in a direction of the center line of the tightening ring 21R in parallel with an edge line of the bent part 22K from a starting point perpendicularly upward bent from the end of the narrow part 22S of the extension part 22 and reaches a first bending point K1 bent at a right angle toward the side of the tightening ring 21R after exceeding this center line.

<<Second Extension Wall V2>>

The second extension wall V2 starts at the first bending point K1 and reaches a second bending point K2 bent in a direction of going away from the center line of the tightening ring 21R again at a right angle just over the bent part 22K.

<<Third Extension Wall V3>>

The third extension wall V3 starts at the second bending point K2 and reaches an end E ended just over the end of the horizontal part 22H.

<<Attachment Part 23T>>

Then, an attachment part 23T is formed in the side opposite to the tightening ring 21R horizontally from the lower end of the third extension wall V3 ranging from the second bending point K2 to the end E, and an insertion hole 23H for the bolt 23B (FIG. 2) constructing fastening means together with a nut 23N (FIG. 2) is opened in this attachment part 23T. In addition, the attachment part 23T may be formed horizontally from the upper end of the third extension wall V3.

<<Third Feature of the Embodiment>>

The embodiment is characterized in that a distance from a center line extending from the center of the tightening ring 21R in the overhang direction to the end of the narrow part 22S of the extension part 22 is made substantially equal to a distance from its center line to the end of the attachment part 23T.

<<Effect of Third Feature of the Embodiment>>

Figure 4:
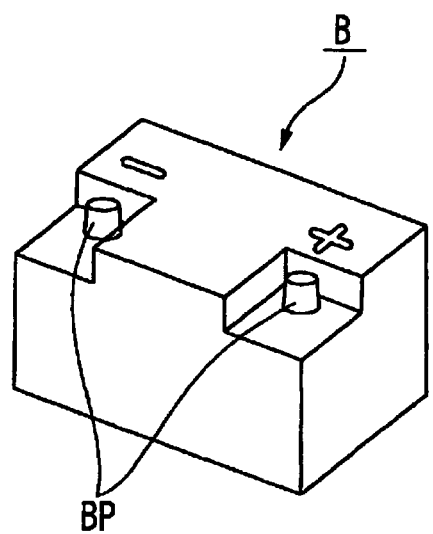
FIG. 4 is a perspective view of a battery having wall surfaces in the sides of battery posts.

In the embodiment, the connection part 23 for connecting to the wire harness is arranged in the transverse side of the current sensor body, so that a transverse dimension (FIG. 2) in the transverse direction increases. However, there is a battery as shown in FIG. 4. That is, the battery respectively has wall surfaces in the sides of a plus battery post and a minus battery post. According to the embodiment, since the transverse dimension increases, there is possibility of interfering with the wall surface in the side of the battery post for the battery as shown in FIG. 4, so that a problem of limiting the attachable battery post to one of the two plus and minus battery posts arises.

The embodiment solves this problem by arranging the battery post in the center of the transverse dimension of the sensor as described above. Consequently, right and left dimensions of protrusion in the transverse direction in the case of attaching the current sensor to the battery post become equal and the attachable battery post is not limited.

<<Fourth Feature of the Embodiment: Integral Formation of Bolt 23B for Fixing Wire Harness>>

The insertion hole 23H (FIG. 3) for the bolt 23B (FIG. 2) constructing the fastening means together with the nut 23N (FIG. 2) is opened in the attachment part 23T (FIG. 3) of the connection part 23 and by the embodiment, the bolt 23B (FIG. 1) for wire harness fixing is inserted into the insertion hole 23H (FIG. 3) of this attachment part 23T (FIG. 3) and is previously integrally formed of resin. Consequently, the need for a conventional step of, for example, welding or crimping the bolt for wire harness fixing is eliminated.

<Wire Harness Terminal WT>

In FIG. 2, the back end of a wire harness terminal WT is connected to the wire harness W and also in the front end of the wire harness terminal WT, a coupling plate WR with substantially the same width as that of the connection part 23 is included in a surface of the wire harness terminal WT. Then, an insertion hole WH aligned with the insertion hole 23H of the connection part 23 in the case of being aligned and stacked on the connection part 23 extends through this coupling plate WR. The bolt 23B for fixing the wire harness molded from resin by the fourth feature of the embodiment is inserted into this insertion hole WH and is tightened with the nut 23N and thereby, electrical connection between the battery post BP and the wire harness W is completed. Finally, connection work is completed by fitting the other connector into a connector 32 of the current sensor 30.

<Current Sensor 30>

The current sensor 30 includes a sensor body 31 for detecting a current supplied from a battery B to a load, and the connector 32 projected integrally to a lateral part of the sensor body 31.

<<Sensor Body 31>>

In the sensor body 31, the magnetic detection element Ms (FIG. 5A) is used as an element for detecting a current and is mounted on the PCB, and the sensor body 31 is made by receiving and arranging the board PCB on which the magnetic detection element Ms is mounted inside the receiving portion 22Y (FIG. 5B) formed of a synthetic resin material so that the magnetic detection element Ms is opposed to a surface of the extension part 22.

<<Connector 32>>

The connector 32 is molded integrally to the sensor body 31 so as to continue to the lateral part of the sensor body 31. The connector 32 is formed in a tube shape opened to one side and a terminal fitting is incorporated into the inside of the connector 32. The connector 32 is fitted into the other connector connected to a current detection circuit, and electrical continuity between the terminal fittings of the inside is enabled.

<<Fifth Feature of the Embodiment: Opening of U-Shaped Shield Plate Sh Turned to Battery Side>>

In FIGS. 5A and 5B, numeral 10 is the battery terminal unit with the current sensor, and numeral 21 is the attachment part, and numeral 22 is the extension part, and numeral 23 is the connection part, and the bolt 23B of the connection part 23 and the extension part 22 are integrally formed of the resin 20B.

Also, numeral 22S is the narrow part (FIG. 3) of the extension part 22 of the bus bar 20A (FIG. 3), and numeral 22Y is the receiving portion for receiving the PCB on which the magnetic detection element is mounted. The sensor used in the current sensor 30 is the magnetic detection element Ms for detecting a magnetic field produced by a current passed through the bus bar. The magnetic detection element Ms is arranged in proximity to the narrow part 22S by receiving the PCB on which the magnetic detection element Ms is mounted inside the receiving portion 22Y formed under the narrow part 22S of the extension part 22. Then, the U-shaped shield plate Sh is inserted from the upper portion of the narrow part 22S and lateral parts of the magnetic detection element Ms and the extension part 22 are covered with the shield plate Sh.

Therefore, when the battery terminal unit 10 with the current sensor is fastened to the battery post, the opening of the U-shaped shield plate Sh is turned to the battery side of the lower surface side and thereby, it is constructed so as not to be influenced by various unnecessary magnetic fields arriving from the upper portion.

<<Effect of Opening of U-Shaped Shield Plate Sh Turned to Battery Side>>

The magnetic detection element used in the embodiment has a possibility of detecting unnecessary magnetic fields from the outside other than a detection target, and this causes an error in an output. Also, when a magnetic substance is arranged in the vicinity of the current sensor, a magnetic field produced by a current of the detection target is disturbed by an influence of the magnetic substance and the error is caused in the output.

As this countermeasure, the embodiment provides the shield plate Sh. The shield plate Sh is formed in a U shape as shown in FIGS. 5A and 5B, and blocks the unnecessary magnetic fields from the outside by covering the magnetic detection element Ms with this shield plate Sh. However, this shield plate Sh has a low shielding effect with respect to the influence of the magnetic substance and the unnecessary magnetic fields from a direction of the U-shaped opening. When the opening of the shield plate Sh is turned upward in the case of attaching the current sensor to a vehicle, a wire harness through which a large current flows or a magnetic substance of a bonnet etc. is arranged in the upper surface side, so that these influences are exerted and thus it is undesirable.

The embodiment is constructed so as not to be influenced by the unnecessary magnetic fields by arranging the opening of the shield plate Sh in the lower surface side in which only the battery is arranged as FIGS. 5A and 5B. Also, it is constructed so that direct drainage into the PCB can be prevented by adopting a structure of assembling the PCB from the lower surface side.

FIG. 6 is a sectional view taken on line A-A of FIG. 2.

In the battery mounting terminal 20 according to the embodiment, the bolt 23B and the bus bar 20A formed by bending are integrally formed by insert molding from the resin 20B. In that case, in the narrow part 22S of the bus bar 20A, the openings are formed in the upward and downward directions and the periphery is molded from resin, and the U-shaped shield plate Sh is inserted into the upward opening and the PCB is received and arranged in the downward opening.

The connector 32 is molded integrally to the sensor body 31 so as to continue to the lateral part of the sensor body 31. The connector 32 is formed in the tube shape opened to one side and a terminal fitting 32T is incorporated into the inside of the connector 32. The connector 32 is fitted into the other connector connected to the current detection circuit, and electrical continuity between the terminal fittings of the inside is enabled. The PCB on which the magnetic detection element Ms is mounted is received and arranged inside the receiving portion 22Y formed under the narrow part 22S.

Then, the U-shaped shield plate Sh is inserted from the upper portion of the narrow part 22S, and various unnecessary magnetic fields arriving from the upper portion are blocked.

<First Summary>

As described above, the embodiment solves the following problems.

(1) Since the connection part for connecting to the wire harness is arranged so as to transversely offset from an extended line of the current sensor and the battery post, the overhang dimension in the case of being attached to the vehicle can be decreased. Therefore, the conventional problem that the large attachment space must be ensured inside the vehicle engine room is solved.

(2) The connection part to the wire harness can be arranged transversely from the extended line of the current sensor and the battery post by processing the bus bar three-dimensionally as shown in FIG. 3. The bus bar is formed integrally to the current sensor body by insert molding and its resin reinforces the strength.

(3) The bolt for fastening to the battery post is arranged in the side opposite to the current sensor body and thereby, the overhang dimension can be decreased further. Therefore, the conventional problem that the large attachment space must be ensured inside the vehicle engine room is solved.

(4) Since the bolt for wire harness fixing is integrally formed, the need for the conventional step of, for example, welding or crimping is eliminated.

(5) Since the connection part to the wire harness is arranged in the transverse side of the current sensor body, the transverse dimension increases. The battery also has a shape as shown in FIG. 4 and there is possibility of interfering with the wall surface in the side of the battery post due to an increase in the transverse dimension. That is, the attachable battery post is limited to one of the two plus and minus battery posts. This problem is solved by arranging the battery post in the center of the transverse dimension of the sensor.

Consequently, the right and left dimensions of protrusion in the transverse direction in the case of attaching the current sensor to the battery post become equal and the attachable battery post is not limited.

(6) The current sensor is a sensor of a magnetic detection type. A magnetic field produced by a current passed through the bus bar is detected by the magnetic detection element. However, detection of the unnecessary magnetic fields from the outside other than the detection target causes an error in an output. Also, when the magnetic substance is arranged in the vicinity of the current sensor, a magnetic field produced by a current of the detection target is disturbed by an influence of the magnetic substance and the error is caused in the output.

As this countermeasure, the shield plate is provided. The shield plate is formed in the U shape as shown in Sh of FIGS. 5A and 5B, and is arranged so as to cover the magnetic detection element Ms. Consequently, the unnecessary magnetic fields from the outside are blocked. However, this shield plate has a low shielding effect with respect to the influence of the magnetic substance and the unnecessary magnetic fields from a direction of the U-shaped opening. Hence, when the opening of the shield plate is turned upward in the case of attaching the current sensor to the vehicle, a wire harness through which a large current flows or a magnetic substance of a bonnet etc. is arranged in the upper surface side, so that it has been proved that these influences are exerted and thus it is undesirable. As a result, the embodiment is constructed so as not to be influenced by the unnecessary magnetic fields by arranging the opening in the lower surface side in which only the battery is arranged as FIGS. 5A and 5B.

(7) Direct drainage into the PCB can be prevented by adopting the structure of assembling the PCB from the lower surface side.

<Additional Improvement>

The subsequent examination has proved that in the embodiment, water tends to collect in the upper side of the shield plate and when the water collects, the shield plate corrodes due to the adhering water and an error may be caused in a sensor output.

Figure 9:
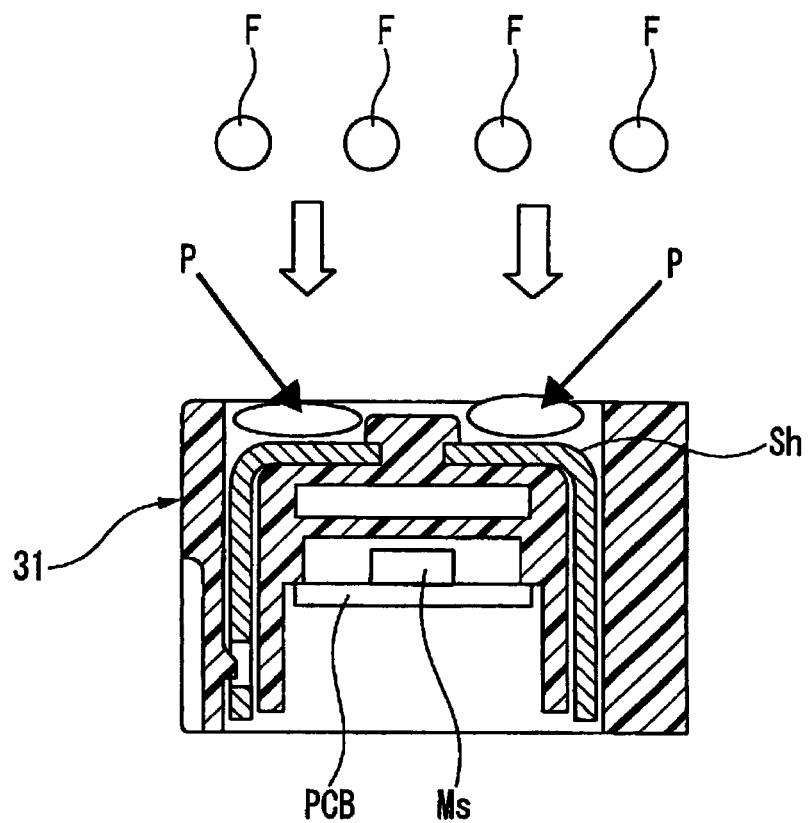
FIG. 9 is a longitudinal sectional view of a sensor body (FIG. 2) for describing the reason why water tends to collect in the upper side of a shield plate.

FIG. 9 is a longitudinal sectional view of the sensor body (FIG. 2) for describing the reason why water tends to collect in the upper side of the shield plate. In FIG. 9, water collects in regions P shown by ellipses in the drawing on the shield plate Sh of the sensor body 31 when water drops F fall from the upper portion of the sensor body 31. In a structure in which four directions are surrounded by walls, it is difficult to drain the collecting water to the outside, so that the water remains collecting on the shield plate Sh, and the shield plate Sh corrodes due to the collecting water and a shielding effect of the shield plate Sh becomes low and in due course, an error may be caused in an output of the magnetic detection element Ms.

Hence, as additional improvements, the following first to third structures are formed in order to prevent water from collecting in the upper side of the shield plate.

<First Structure for Preventing Water from Collecting: Upper Notch>

Figure 10:
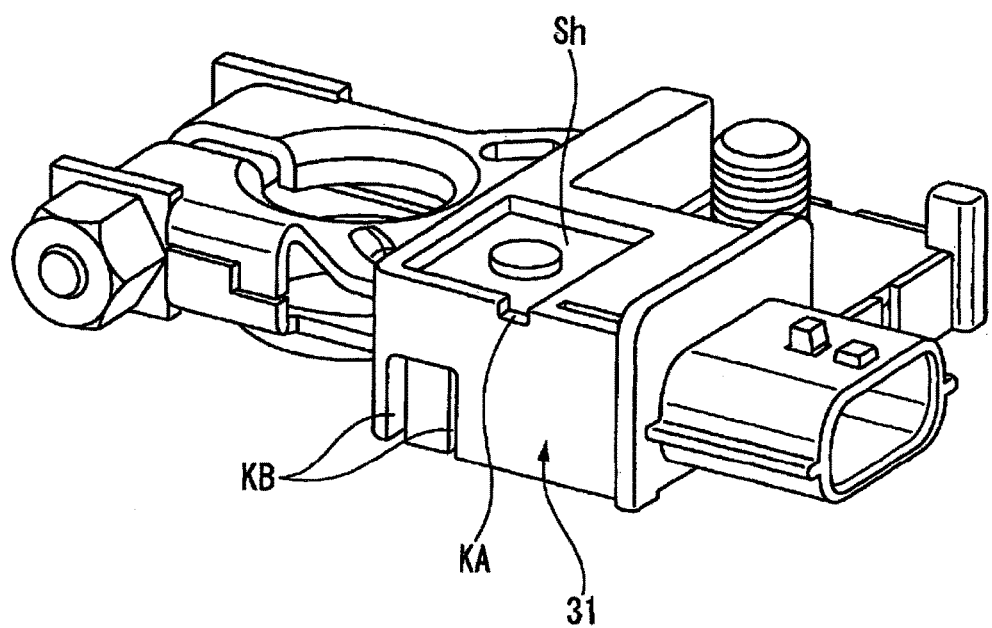
FIG. 10 is a perspective view of a battery terminal unit with a current sensor.

FIG. 10 and FIGS. 11A and 11B are views describing the first structure for preventing water from collecting, and FIG. 10 is a perspective view of a battery terminal unit with a current sensor, and FIG. 11A is a plan view of the battery terminal unit with the current sensor, and FIG. 11B is a sectional view taken on line B-B of FIG. 11A.

The first structure is characterized in that a notch KA is formed in an upper wall surface of the sensor body 31 in FIG. 10 and FIGS. 11A and 11B. By forming the notch KA in the upper wall surface of the sensor body 31, the water drops F falling on the shield plate Sh are drained to the outside of the sensor body 31 through the notch KA as shown by an arrow and the water does not collect on the shield plate Sh. Therefore, the shield plate Sh does not corrode and the error is not caused in the output of the magnetic detection element Ms.

In addition, in the drawings, the notch KA is formed in one place, but when the notches are spaced backward and forward in two places, water is drained smoothly in both cases where the water moves on the shield plate Sh backward and forward by acceleration and deceleration of a vehicle, so that this is more effective.

<Second Structure for Preventing Water from Collecting: Lower Slit>

FIG. 10 and FIGS. 12A and 12B are views describing the second structure for preventing water from collecting, and FIG. 12A is a front view of the battery terminal unit with the current sensor, and FIG. 12B is a sectional view taken on line C-C of FIG. 12A.

The second structure is characterized in that elongated slits KB extending through a wall surface are formed in a lower wall surface of the sensor body 31 in FIG. 10 and FIGS. 12A and 12B.

By forming the elongated slits KB extending through the wall surface in the lower wall surface of the sensor body 31, the water drops F falling on the shield plate Sh are drained to the outside of the sensor body 31 through the elongated slits KB as shown by an arrow and the water does not collect on the shield plate Sh. Therefore, the shield plate Sh does not corrode and the error is not caused in the output of the magnetic detection element Ms.

In addition, the reason why the slits KB are spaced in two places in the drawings is because water is enabled to be drained smoothly in both cases where the water moves on the shield plate Sh backward and forward by acceleration and deceleration of the vehicle.

<Additional Effect of Slit>

Figure 13A:
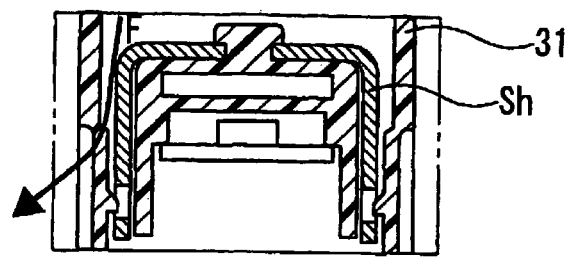
FIG. 13A is a sectional view taken on line D-D of the battery terminal unit with the current sensor of FIG. 12A.
Figure 13B:
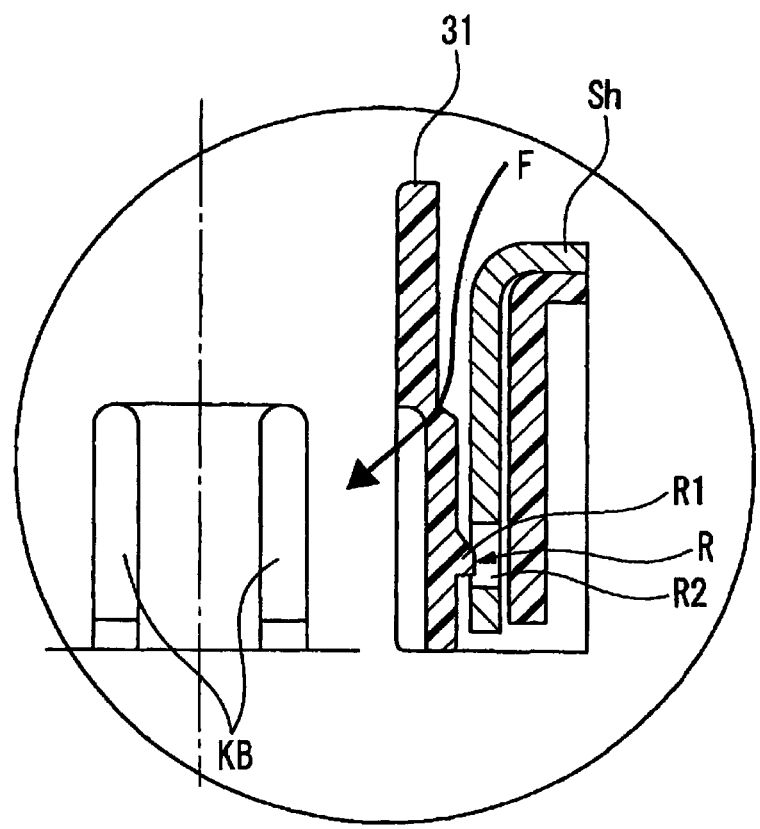
FIG. 13B is a partially enlarged view of each of FIG. 12A and FIG. 13A.

FIGS. 13A and 13B are views describing an additional effect of the slits KB, and FIG. 13A is a sectional view taken on line D-D of the battery terminal unit with the current sensor of FIG. 12A, and FIG. 13B is a partially enlarged view of each of FIG. 12A and FIG. 13A.

In FIG. 13B, a wall surface of the sensor body 31 is thin formed to generate elasticity and while the side of the shield plate Sh on the wall surface of the sensor body 31 is provided with a projection R1 for locking, a region opposed to the projection R1 for locking in the shield plate Sh is provided with a locking hole R2. Consequently, a lock R for temporary fixing of the shield plate Sh is formed.

Drainage and the lock R for temporary fixing of the shield plate Sh can be implemented simultaneously by forming the slits KB.

<Third Structure for Preventing Water from Collecting: Vertical Through Hole>

Figure 14B:
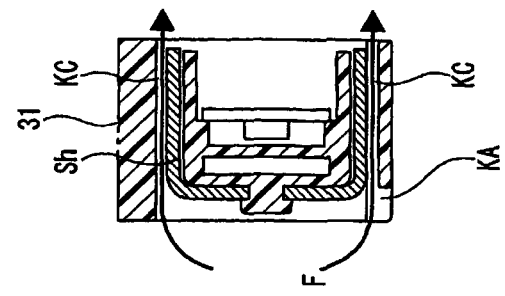
FIG. 14B is a sectional view taken on line E-E of FIG. 14A.
Figure 14A:
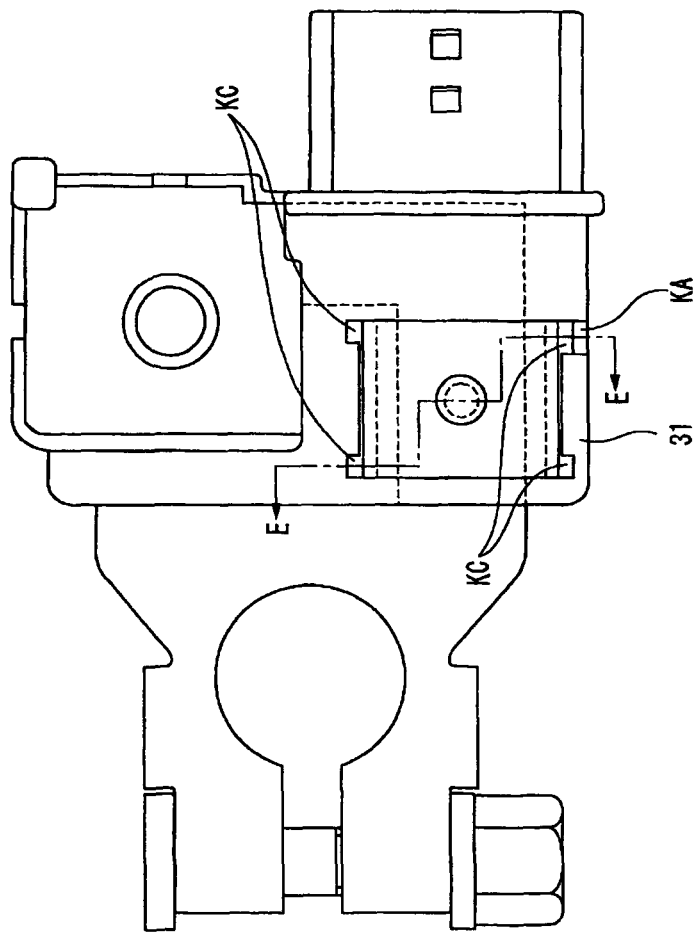
FIG. 14A is a plan view of the battery terminal unit with the current sensor.

FIGS. 14A and 14B are views describing the third structure for preventing water from collecting, and FIG. 14A is a plan view of the battery terminal unit with the current sensor, and FIG. 14B is a sectional view taken on line E-E of FIG. 14A.

The third structure is characterized in that through holes KC vertically pierced along a wall surface are formed in four places of the right and left and the front and back of a traveling direction of the vehicle inside the wall surface of the sensor body 31 in FIGS. 14A and 14B.

By forming the through holes KC vertically pierced along the wall surface of the sensor body 31, the water drops F falling on the shield plate Sh are drained from the lower portion of the sensor body 31 to the outside through the through holes KC acting as drainage holes as shown by arrows and the water does not collect on the shield plate Sh. Therefore, the shield plate Sh does not corrode and the error is not caused in the output of the magnetic detection element Ms.

In addition, the reason why the through holes KC are formed in the four places is because water is enabled to be drained smoothly even when the water moves on the shield plate Sh in various directions by right and left sway or acceleration and deceleration of the vehicle.

Also, when the through holes KC are formed inside the upper notch KA of the first structure for preventing water from collecting, drainage efficiency improves since the water is drained from the respective through holes KC and notch KA.

<Second Summary>

By forming one or more of (1) the upper notch, (2) the lower slit and (3) the vertical through hole in the wall surface in which the shield plate is received as described above, the water drops falling from the upper portion of the sensor body flow out to the outside of the sensor body speedily, so that the shield plate does not corrode and therefore, the fear of causing the error in the output of the magnetic detection element is eliminated.

The present application is based on Japanese Patent Application No. 2010-105309 filed on Apr. 30, 2010 and Japanese Patent Application No. 2010-254104 filed on Nov. 12, 2010, the contents of which are incorporated herein by reference.

INDUSTRIAL APPLICABILITY

This invention can provide a battery terminal unit with a current sensor unnecessary to ensure large attachment space inside a vehicle engine room.

REFERENCE SIGNS LIST

10 BATTERY TERMINAL UNIT WITH CURRENT SENSOR
20 BATTERY MOUNTING TERMINAL
20A BUS BAR
20B RESIN
21 ATTACHMENT PART
21R TIGHTENING RING
21W OPPOSED WALL
21B BOLT FOR FASTENING
21H THROUGH HOLE
21N NUT
21S SLIT
22 EXTENSION PART
22W WIDE PART
22K BENT PART
22H HORIZONTAL PART
22S NARROW PART
22Y RECEIVING PORTION
23 CONNECTION PART
23V EXTENDING PORTION
V1 FIRST EXTENSION WALL
V2 SECOND EXTENSION WALL
V3 THIRD EXTENSION WALL
K1 FIRST BENDING POINT
K2 SECOND BENDING POINT
23T ATTACHMENT PART
23N NUT
23B BOLT FOR WIRE HARNESS FIXING
23H INSERTION HOLE
30 CURRENT SENSOR
31 SENSOR BODY
32 CONNECTOR
32T TERMINAL FITTING
B BATTERY
BP BATTERY POST
W WIRE HARNESS
Sh U-SHAPED SHIELD PLATE
Ms MAGNETIC DETECTION ELEMENT
KA NOTCH
KB SLIT
KC THROUGH HOLE
R LOCK FOR TEMPORARY FIXING
R1 PROJECTION FOR LOCKING
R2 LOCKING HOLE

The invention claimed is:

1. A battery terminal unit with a current sensor, the battery terminal unit comprising:
a bus bar for a battery terminal, the bus bar including:
an attachment part configured to attach to a battery post;
an extension part extended from the attachment part; and
a connection part which continues from the extension part and is configured to connect to a wire harness; and
a current sensor including a board having a magnetic detection element and a shield plate having a U shape so that both ends of the shield plate are connected to the board so as to define two opening portions oppositely opening,
wherein the extension part is inserted through the openings and extends inside the current sensor,
wherein the board is opposed to a surface of the extension part inside the current sensor,
wherein the attachment part, the extension part, and the connection part are integrally formed, and are configured in a unity member, and
wherein the connection part is connected to one end of the extension part at an opposite side to the attachment part and extends in a transverse direction substantially perpendicular to an overhang direction of the extension part, so that a part of the connection part configured to be connect to the wire harness is disposed on a position offset from the extension part in the transverse direction, and
wherein the connection part includes an extending portion which is bent from the one end of the extension part in a vertical direction perpendicular to both of the overhang direction and the transverse direction so as to be erected in the vertical direction.

2. The battery terminal unit according to claim 1, wherein the attachment part includes:
a cylindrical part having a slit; and
opposing walls extended from both ends of the cylindrical part so as to be opposed to each other, both ends being adjacent to the slit, and the opposing walls having through holes respectively,
wherein the opposing walls, the cylindrical part, and the extension part are arranged in said order; and
wherein the attachment part pinches the cylindrical part to a battery post by fastening a fastening member inserted into the through holes of the opposing walls with respect to the opposing walls.

3. The battery terminal unit according to claim 1,
wherein the extension part has a first face and a second face which is opposite to the first face,
wherein the board is provided at a side of the second face;
wherein the shield plate, is provided at a side of the first face of the extension part; and
wherein one of the opening portions of the shield plate is arranged so as to be directed to a battery.

4. The battery terminal unit according to claim 3, further comprising:
a receiving portion that accommodates the board,
wherein a drainage path for draining water drops falling on the shield plate to the outside of the receiving portion is formed in a peripheral wall constructing the receiving portion.

5. The battery terminal unit according to claim 4, wherein the drainage path comprises at least one of a notch in which a part of an upper portion of the peripheral wall is notched, an elongated slit extending through at a lower portion of the peripheral wall, and a through hole vertically extending and formed on the peripheral wall.

6. The battery terminal unit of claim 1, wherein a tightening ring of the attachment part and the board in the receiving portion are arranged on the overhang direction, and the extension part and an insertion hole of the connection part are arranged along the transverse direction.

7. The battery terminal unit of claim 1, further comprising a bolt for fixing the wire harness to the connection part, wherein the bolt opens in an upward direction with respect to a battery when the battery terminal unit is attached to the battery.

8. The battery terminal unit according to claim 1, wherein the extension part has an L-shape when viewed along the overhang direction.

9. The battery terminal unit of claim 1, wherein the extending portion includes at least one of a first extension wall, a second extension wall and a third extension wall,
wherein the first extension wall is connected to the second extension wall through a first bent portion, and the second extension wall is bent in a substantially right angle with respect to the first extension wall at the first bent portion, and
wherein the second extension wall is connected to the third extension wall through a second bent portion, and the third extension wall is bent in a substantially right angle with respect to the second extension wall at the second bent portion.

10. The battery terminal unit according to claim 1,
wherein the attachment part integrally comprises a tightening ring and opposed walls,
wherein the opposed walls are extended upwards from the tightening ring in a direction substantially perpendicular to both of the overhang direction and the transverse direction,
wherein each of the opposed walls comprises one of a plurality of through holes configured to receive an element and tighten the tightening ring,
wherein the tightening ring is configured to receive the battery post, and
wherein the opposed walls and the ones of the plurality of through holes are arranged at a side of the attachment part opposite to the side from which the extending part extends and with the battery post therebetween.

* * * * *